United States Patent [19]

Takeda et al.

[11] Patent Number: 4,859,568
[45] Date of Patent: * Aug. 22, 1989

[54] PHOTOGRAPHIC IMAGE RECORDING METHOD USING SILVER HALIDE AND VINYL MONOMER

[75] Inventors: Keiji Takeda, Kanagawa; Yoshihide Hayakawa, Tokyo, both of Japan

[73] Assignee: Fuji Photo Film Co., Ltd., Kanagawa, Japan

[*] Notice: The portion of the term of this patent subsequent to Dec. 16, 2003 has been disclaimed.

[21] Appl. No.: 42,548

[22] Filed: Apr. 27, 1987

Related U.S. Application Data

[63] Continuation of Ser. No. 827,702, Feb. 10, 1986, abandoned.

[30] Foreign Application Priority Data

Feb. 8, 1985 [JP] Japan .................................. 60-22980
Feb. 18, 1985 [JP] Japan .................................. 60-29894
Apr. 1, 1985 [JP] Japan .................................. 60-68874

[51] Int. Cl.$^4$ ............................................. G03C 5/00
[52] U.S. Cl. .................................... 430/269; 430/270; 430/271; 430/264; 430/330; 430/434; 430/477; 430/919
[58] Field of Search ............... 430/270, 281, 264, 330, 430/434, 477, 919, 369

[56] References Cited

U.S. PATENT DOCUMENTS

4,560,637 12/1985 Maeda et al. ...................... 430/281
4,629,676 12/1986 Hayakawa et al. .

Primary Examiner—Jack P. Brammer
Attorney, Agent, or Firm—Sughrue, Mion, Zinn, Macpeak & Seas

[57] ABSTRACT

A method for recording a photographic image on an image-recording material is provided, wherein an image-recording material formed by coating at least a photographic silver halide, a polymerizable vinyl monomer, and a hydrazine derivative represented by formula (I)

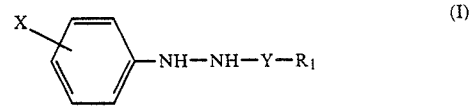

wherein X represents a hydrogen atom, an alkyl group, or a group represented by

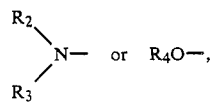

positioned in an ortho-, meta-, or para-position on the benzene ring; Y represents

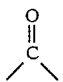

or $-SO_2-$; $R_1$, $R_2$, $R_3$, and $R_4$ each represents a hydrogen atom, an unsubstituted alkyl group, or a substituted alkyl group, provided that $R_1$ represents a hydrogen atom only when Y represents

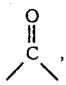

on a support is imagewise exposed to form a latent image in said photographic silver halide and then heated so as to polymerize said polymerizable vinyl monomer in the part having said latent image to form a polymer image therein.

The present process does not require any wet treatment, and is capable of forming a polymer image simply by heating for a short period of time, and thus, may record a polymer image with a photo-sensitivity which is comparable to that of a conventional silver halide photographic material, with the use of only a small amount of silver halide.

15 Claims, No Drawings

PHOTOGRAPHIC IMAGE RECORDING METHOD USING SILVER HALIDE AND VINYL MONOMER

This is a continuation of Ser. No. 827,702, filed 2/10/86, now abandoned.

FIELD OF THE INVENTION

The present invention relates to a method for recording photographic images, and more particularly to a method for formation of a polymer image on a photographic material wherein polymerizable monomers are polymerized in the presence of silver halide in a dry-system treatment.

BACKGROUND OF THE INVENTION

Techniques for forming a polymer image by photopolymerization in which an organic dye is used as a photo-sensitizer (photo-polymerization initiator) are well known, but the sensitivity thereof is generally ISO $10^{-3}$ or less (ISO: International Organization for Standardization), which is far inferior to the sensitivity of silver halide photographic materials. Various methods have heretofore been tried in which a silver halide is used as a trigger and the high amplification degree thereof in a development procedure is utilized for initiation of the polymerization reaction. For instance, Japanese Patent Publication Nos. 46-6581 and 46-16357, Japanese Patent Application (OPI) Nos. 57-138632, 57-142638, 57-176033, 58-107529, 58-169143, and 58-174947 (the term "OPI" as used herein refers to a "published unexamined Japanese patent application"), and U.S. Pat. Nos. 3,707,379, 3,767,400, 3,782,943, 3,697,275, 3,756,818, 3,687,667, 3,874,947, 3,756,820 and 3,746,542 describe a polymerization method in which the polymerization reaction is initiated by a radical derived from a reducing agent oxidized during development of silver halide. Japanese Patent Publication No. 41-18862 (corresponding to U.S. Pat. No. 3,241,962) describes a polymerization method in which a polymerization reaction is initiated by a radical derived from a peroxide, due to the redox reaction of a silver image obtained by development of a silver halide and a peroxide. Japanese Patent Publication No. 39-2657 (corresponding to U.S. Pat. No. 3,345,164) describes a polymerization method in which the polymerization reaction is initiated by a radical derived from a peroxide, due to the redox reaction of a silver ion as remaining in a non-exposed part and dissolved out therefrom, after development of a silver halide, and a peroxide. U.S. Pat. No. 3,029,145 describes a polymerization method in which the polymerization reaction is initiated by a radical derived from a peroxide, due to the redox reaction of an iron(I)-salt remaining in a non-exposed part, after development of a silver halide with an iron(I)-salt, and a peroxide. Japanese Patent Application (OPI) No. 55-149939 (corresponding to U.S. Pat. No. 4,287,290) describes a polymerization method in which the polymerization reaction is directly initiated by a reducing agent remaining in a non-exposed part, after development of a silver halide.

In these methods, monomers are polymerized in the presence of a radical generated directly or after post-treatment from any of raw materials (silver halide or reducing agent) or products (silver image or oxidation-product of reducing agent) as participated in the development of a silver halide. It is assumed that a polymer image is formed with a sensitivity similar to a silver halide in said methods; however, such methods have the disadvantage that a wet treatment is required in every development of silver halide and polymerization in the presence of a radical. Also, in methods using a peroxide, deterioration of recording materials and occurrence of fog are usually significant during the dark-polymerization to be carried out in the presence of a radical formed by decomposition of said peroxide. In addition, the polymerization reaction requires, in general, a long time period.

SUMMARY OF THE INVENTION

The object of the present invention is to overcome the disadvantages and defects in the prior art and to provide a novel photographic image recording method, which does not require any wet treatment, but which rather can form a polymer image by only heating for a short period of time. Thus, the present novel method may record a polymer image with a photo-sensitivity which is comparable to that of a conventional silver halide photographic material, using only a small amount of silver halide.

The present inventors have now found that a good polymer image of high sensitivity may be formed by only heating for a short period of time when a specific hydrazine derivative is used as a developing agent of a silver halide and a polymerization initiator.

Accordingly, the present invention provides a method for recording a photographic image on an image-recording material, wherein an image-recording material formed by coating at least a photographic silver halide, a polymerizable vinyl monomer, and a hydrazine derivative represented by formula (I)

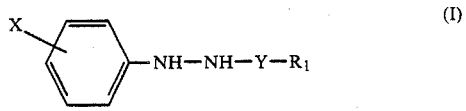

wherein X represents a hydrogen atom, an alkyl group, or a group represented by

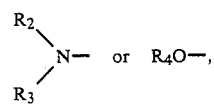

positioned in an ortho-, meta- or para-position on the benzene ring; Y represents

or $-SO_2-$; $R_1$, $R_2$, $R_3$, and $R_4$ each represents a hydrogen atom, an unsubstituted alkyl group, or a substituted alkyl group, provided that $R_1$ represents hydrogen atom only when Y represents

on a support is imagewise exposed to form a latent image in said photographic silver halide and then heated so as to polymerize said polymerizable vinyl monomer in the part having said latent image to form a polymer image therein.

In the hydrazine derivative of formula (I), X is preferably

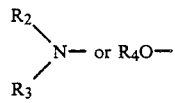

positioned in an ortho- or para-position of the benzene ring.

DETAILED DESCRIPTION OF THE INVENTION

The image recording material to be used in the present invention basically has a photographic layer comprising a photographic silver halide, a polymerizable vinyl monomer, the above-described hydrazine derivative, and, in general, an additional binder polymer, coated on a support. Said photographic layer may be a single layer or otherwise, may comprise two or more adjacent layers, and each layer may freely contain the above-described components. Accordingly, a photographic silver halide-containing layer and a polymerizable vinyl monomer-containing layer are provided on a support and said hydrazine derivative may be incorporated in either of said layers; or alternatively, a separate layer containing said hydrazine derivative only may be provided. The order of these layers to be coated on the support is not specifically limitative. In view of cost, a single layer is preferred.

Said photographic layer may further contain, in order to enhance the polymerization reaction efficiency, various kinds of an organic silver salt-oxidizing agent, a base or base precursor, and a hot-melting solvent, as described below in detail. Moreover, in case the formed polymer image is required to be made visible, some substance, e.g., coloring agent such as a dye, a pigment, a dye precursor, etc. which is necessary therefor may be incorporated in the photographic layer of the present invention, as hereunder described in detail.

A characteristic feature of the present invention is to use the hydrazine derivatives of formula (I), which are selected from $\beta$-acyl-p(or -o)-amino(or -monoalkylamino, or -dialkylamino)phenylhydrazines, $\beta$-acyl-p(or -o)-alkoxyphenylhydrazines, $\beta$-alkylsulfonyl-p(or -o)-amino(or -monoalkylamino, or -dialkylamino)-phenylhydrazines, $\beta$-alkylsulfonyl-p(or -o)-alkoxyphenylhydrazines, $\beta$-acyl-p(or -o)-alkylphenylhydrazines, and $\beta$-acyl-phenylhydrazines.

In the formula (I), when $R_1$ through $R_4$ represent an unsubstituted alkyl group or a substituted alkyl group, said alkyl group may be either linear or branched and have from 1 to 18 carbon atoms, preferably from 1 to 5 carbon atoms. Examples of alkyl groups are a methyl group, an ethyl group, an n-propyl group, an isopropyl group, an n-butyl group, an iso-butyl group, a tert-butyl group, an n-amyl group, an iso-amyl group, a tert-amyl group, etc. Examples of substituents of said alkyl groups are a hydroxyl group, a chlorine, or bromine atom, an alkoxy group having from 1 to 5 carbon atoms, a phenyl group, a substituted phenyl group (which is substituted in any of o-, m-, or p-position by a substituent of a chlorine or bromine atom or an alkyl group having from 1 to 5 carbon atoms, or an alkoxy group having from 1 to 5 carbon atoms), an acyl group having from 1 to 5 carbon atoms, etc.

Examples of preferred compounds are as follows: $\beta$-acetyl-p(or -o)-aminophenylhydrazine, $\beta$-formyl-p(or -o)-aminophenylhydrazine, $\beta$-propionyl-p(or -o)-aminophenylhydrazine, $\beta$-butyryl-p(or -o)-aminophenylhydrazine, $\beta$-isobutyryl-p(or -o)-aminophenylhydrazine, $\beta$-chloroacetyl-p(or -o)-aminophenylhydrazine, $\beta$-acetyl-p(or -o)-N-methylaminophenylhydrazine, $\beta$acetyl-p(or -o)-N,N-dimethylaminophenylhydrazine, $\beta$-acetyl-p(or -o)-N,N-diethylaminophenylhydrazine, $\beta$-formyl-p(or -o)-N,N-dimethylaminophenylhydrazine, $\beta$-propionyl-p(or -o)-N,N-dimethylaminophenylhydrazine, $\beta$-acetyl-p(or -o)-methoxyphenylhydrazine, $\beta$-acetyl-p(or -o)-ethoxyphenylhydrazine, $\beta$-formyl-p(or -o)-methoxyphenylhydrazine, $\beta$-methylsulfonyl-p(or -o)-aminophenylhydrazine, $\beta$-methylsulfonyl-p(or -o)-methoxyphenylhydrazine, $\beta$-acetylphenylhydrazine, $\beta$-propionylphenylhydrazine, $\beta$-formylphenylhydrazine, $\beta$-chloroacetylphenylhydrazine, $\beta$-hydroxypropionylphenylhydrazine, $\beta$-methoxyacetylphenylhydrazine, $\beta$-acetyl-p-tolylhydrazine, $\beta$-formyl-p-tolylhydrazine, $\beta$-acetyl-o-tolylhydrazine, $\beta$-1,1-dihydroxymethylpropionyl-p-tolylhydrazine, $\beta$-trihydroxymethylacetyl-p-tolylhydrazine, $\beta$-chloroacetyl-p-ethylphenylhydrazine, etc.

Photographic silver halides to be used in the present invention are those obtained in conventional means, including silver chloride, silver bromochloride, silver iodochloride, silver bromide, silver bromoiodide, silver bromoiodochloride, and silver iodide. The particle size of said silver halide is generally within the range of from 0.001 $\mu$m to 10 $\mu$m, preferably from 0.001 $\mu$m to 2 $\mu$m. Silver halides may be chemically sensitized, for example, with a chemical sensitizer such as sulfur, selenium, tellurium, gold, platinum, palladium, rhodium, iridium, or with a reducing agent for a silver halide. In addition, these may optionally be spectral-sensitized in a conventional manner. Such means are described in detail in the technical literature, such as T. H. James, *The Theory of the Photographic Process*, 4th Edition, Macmillan Publishing Co., Inc., 1977; etc.

Such spectral-sensitization is advantageous for enhancement of the sensitivity of photographic silver halides or for selection of the photographic wavelength range.

Dyes which may be used therefor include methine dyes, cyanine dyes, merocyanine dyes, complex cyanine dyes, complex merocyanine dyes, holopolar cyanine dyes, hemicyanine dyes, styryl dyes and hemioxonol dyes. Especially useful dyes are cyanine dyes, merocyanine dyes, and complex merocyanine dyes. Any and every basic heterocyclic nucleus which is generally used in cyanine dyes may be applied to said dyes. For instance, the following nuclei may be applied thereto: pyrroline nucleus, oxazoline nucleus, thiazoline nucleus, pyrrole nucleus, oxazole nucleus, thiazole nucleus, selenazole nucleus, imidazole nucleus, tetrazole nucleus, pyridine nucleus, etc.; alicyclic hydrocarbon ring-fused nuclei of said nuclei: and aromatic hydrocarbon ring-fused nuclei of said nuclei, such as indolenine nucleus, benzindolenine nucleus, indole nucleus, benzoxazole nucleus, naphthoxazole nucleus, benzothiazole nucleus, naphthothiazole nucleus, benzoselenazole nucleus, benzimidazole nucleus, quinoline nucleus, etc. These nuclei may be substituted on their carbon atoms.

To merocyanine dyes or complex merocyanine dyes may be applied a ketomethylene structure-containing nucleus such as pyrazolin-5-one nucleus, thiohydantoin nucleus, 2-thiooxazolidine-2,4-dione nucleus, thiazolidine-2,4-dione nucleus, rhodanine nucleus, thiobarbituric acid nucleus, or the like 5- or 6-membered heterocyclic nucleus.

These sensitizer dyes may be used singly or in the form of a combination of two or more thereof, and the combination of sensitizer dyes is often used, especially for the purpose of super-sensitization.

Other dyes which per se do not have any spectral-sensitization activity or some other substances which do not substantially absorb any visible ray but have a supersensitization activity, may be incorporated in the emulsion, together with said sensitizing dyes. For instance, nitrogen-containing heterocyclic ring-substituted aminostyryl compounds (for example, those as descried in U.S. Pat. Nos. 2,933,390 and 3,635,721), aromatic organic acid/formaldehyde condensation products (for example, those as described in U.S. Pat. No. 3,743,510), cadmium salts, azaindene compounds, etc. may be incorporated in the emulsion. In particular, the combinations as described in U.S. Pat. Nos. 3,615,613, 3,615,641, 3,617,295 and 3,635,721 are preferred.

The recording materials of the present invention may contain, together with a photographic silver halide, an organic silver salt-oxidizing agent, for the purpose of oxidizing a reducing agent in the part where a latent image is to be formed when heated. These silver salts are relatively stable to light, but when heated in the presence of a silver halide having a latent image, these may oxidize a reducing agent and themselves are reduced to silver. Examples of said silver salts are silver salts of a fatty acid (such as behenic acid, stearic acid, lauric acid, maleic acid, adipic acid, etc.), an aromatic carboxylic acid (such as benzoic acid, phthalic acid, terephthalic acid, salicylic acid, etc.), a mercapto group- or thione group-containing compound (such as 3-mercapto-4-phenyl-1,2,4-triazole, 2-mercaptobenzimidazole, etc.) or an imino group-containing compound (such as benzotriazole or derivatives thereof as described in Japanese Patent Publication Nos. 44-30270 (corresponding to British Pat. No. 1,173,426) and 45-18416 (corresponding to U.S. Pat. No. 3,635,719), etc.).

Polymerizable vinyl monomers which may be used in the present invention are compounds which have at least one vinyl group or vinylidene group and which may be radical-polymerized; and conventional known esters of acrylic acid or methacrylic acid, metal salts of acrylic acid (such as barium acrylate, calcium acrylate), acrylamide, N,N-methylenebis-acrylamide, vinylethers, N-vinyl compounds (such as N-vinylcarbazole), vinyl acetates, etc., may be used. Esters of acrylic acid or methacrylic acid are especially preferred in the present invention, among them. Examples of said monomers are mentioned below, in terms of esters of acrylic acid. (Compounds in which one or more acryloyl groups are replaced by the methacryloyl groups are also able to be used in the present invention.) Monoacrylates such as methyl acrylate, ethyl acrylate or butyl acrylate; diacrylates such as polyethyleneglycol diacrylate, polypropyleneglycol diacrylate, hexanediol diacrylate, glycerin diacrylate, trimethylolpropane diacrylate, pentaerythritol diacrylate; tri- and tetra-acrylates such as trimethylolpropane triacrylate, pentaerythritol triacrylate, pentaerythritol tetraacrylate; and other various polymerizable prepolymers, for example, oligomers obtained by reaction of a hydroxyl residue of a polyester and acrylic acid, said polyester being formed by condensation of a poly-basic acid (such as phthalic acid, isophthalic acid, terephthalic acid, maleic acid, fumaric acid, malonic acid, succinic acid, adipic acid, etc.) and a polyhydric alcohol (such as ethyleneglycol, propyleneglycol, polyethyleneglycol, polypropyleneglycol, glycerin, trimethylolpropane, trimethylolethane, pentaerythritol, etc.), or in other words, polyester-acrylates (or oligo-ester-acrylates), as described in Japanese Patent Publication No. 52-7361, and epoxy-acrylates and polyurethane-acrylates obtained by reaction of a hydroxyl group-containing acrylate and an isocyanate, as described in Japanese Patent Publication No. 48-41708.

Two or more monomers may be used together in the method of the present invention.

The coating layer to be provided on the image-recording material used in the present invention preferably contain a binder polymer. Examples of said binder polymers are water-soluble polymers such as gelatin, polyvinylalcohol, polyvinyl-pyrrolidone, carboxymethyl-cellulose, gum arabic, casein and methyl-cellulose, and organic solvent-soluble polymers such as polymethyl methacrylate, polyvinyl chloride, vinylidene chloride-vinyl chloride copolymer, vinylidene chloride-acrylonitrile copolymer, polyvinyl acetate, vinyl acetate-vinyl chloride copolymer, styreneacrylonitrile copolymer, polyesters, ABS resin, polyamides, chlorinated polyethylene, chlorinated polypropylene, polyvinyl-butyral, polyvinylformal and acetyl-cellulose. Solvents to be used for dissolving and coating said polymers are water, acetone, toluene, methylene chloride, methylene dichloride, chloroform, methylethylketone, ethyl acetate, methyl acetate, dimethylformamide, dimethylsulfoxide, etc.

Said binder polymers may be used singly or in the form of a combination of two or more kinds thereof. For instance, a silver halide is prepared in the form of a gelatin-emulsion, which may be added to a coating solution comprising a binder other than gelatin and a monomer, and the thus-prepared coating solution may be coated on the image recording material of the present invention. In this case, the mixture comprising two or more binders is not necessarily blended uniformly. In addition, the monomer is not also necessarily blended uniformly with the binder. For example, a water-insoluble monomer may be dispersed in an aqueous solution of a water-soluble binder or may be non-uniformly dispersed therein in the form of micro-capsules.

The hydrazine derivatives of formula (I) is dissolved or dispersed in water or an organic solvent which is compatible with the solvent of the binder, and then may be added to the coating solution.

The photographic layer of the present invention may contain, if desired, a base or a base precursor capable of forming a base under heat, for the purpose of accelerating the development of silver halides and organic silver salt-oxidizing agents.

Examples of preferred bases are inorganic bases such as alkali metal or alkaline earth metal hydroxides, secondary or tertiary phosphates, borates, carbonates, quinolinates, metaborates; ammonium hydroxides; quaternary alkylammonium hydroxides, and other metal hydroxides; and organic bases such as aliphatic amines (e.g., trialkylamines, hydroxylamines, aliphatic polyamides); aromatic amines (e.g., N-alkyl-substituted aromatic amines, N-hydroxyalkyl-substituted aromatic amines and bis [p-(dialkylamino)phenyl]methanes); heterocyclic amines, amidines (including cyclic amines), guanidine (including cyclic guanidines), etc. Among them, those having a pKa value of 8 or more are especially preferred.

In case a base is to be incorporated in the photographic material, it is preferred that said base be added to said material in the form of a precursor thereof.

As base precursors, those capable of releasing a base through some reaction under heat are preferably used, including a salt of an organic acid and a base capable of decarboxylating and decomposing under heat or a compound capable of decomposing and releasing an amine due to the intramolecular nucleophilic substitution-reaction, Lossen rearrangement, Beckmann rearrangement, or like reaction. Examples of preferred base precursors are salts of trichloro-acetic acid, as described in British Pat. No. 998,949; salts of α-sulfonyl-acetic acid as described in U.S. Pat. No. 4,060,420; salts of propiolic acid as described in Japanese Patent Application No. 58-55700; 2-carboxy-carboxamide derivatives as described in U.S. Pat. No. 4,088,496; salts of pyrolytic acids, in which an alkali metal or alkaline earth metal component is used besides an organic base, as a base component, as described in Japanese Patent Application (OPI) No. 59-195237 (corresponding to European Patent Publication No. 125521A); hydroxamine-carbamates as described in Japanese Patent Application (OPI) No. 59-168440 (corresponding to European Patent Publication No. 120661A), in which Lossen rearrangement is utilized; aldoxime-carbamates capable of forming nitrile under heat, as described in Japanese Patent Application (OPI) No. 59-157637 (corresponding to European Patent Publication No. 118078A), etc. In addition, other base precursors as described in British Pat. No. 998,945, U.S. Pat. No. 3,220,846, Japanese Patent Application (OPI) No. 50-22625 (corresponding to British Pat. No. 1,470,451), and British Pat. No. 2,079,480 are also useful.

Specific examples of base precursors which are especially useful in the present invention include guanidine trichloro-acetate, methylguanidine trichloro-acetate, potassium trichloro-acetate, guanidine phenylsulfonyl-acetate, guanidine p-chlorophenylsulfonyl-acetate, guanidine p-methanesulfonylphenyl-sulfonylacetate, potassium phenyl-propiolate, cesium phenyl-propiolate, guanidine phenyl-propiolate, guanidine p-chlorophenyl-propiolate, guanidine 2,4-dichlorophenyl-propiolate, guanidine p-phenylene-bis-propiolate, tetramethylammonium phenylsulfonyl-acetate, tetramethylammonium phenyl-propiolate.

These base precursors may be used singly or in the form of a mixture of two or more thereof.

The photographic layer may further contain, optionally and rather preferably, a hot-melting solvent, for the purpose of accelerating the heat-development of the silver halide and the organic silver salt-oxidizing agent contained therein and also accelerating the polymerization reaction of polymerizable monomers contained therein, and in general, incorporation of such hot-melting solvent in the photographic layer is preferred. Hot-melting solvents include substances having a melting point in the temperature of the heat-development, for example, within the range of 80° C. to 200° C., and dissolving the hydrazine derivatives of formula (I), when molten, or softening the photographic layer, so as to accelerate the movement of said derivative, and in addition, said hot-melting solvents can hardly react with silver salts, monomers, and hydrazine derivatives.

These solvents may be selected from organic or inorganic compounds of an extremely broad range, and concrete examples thereof are polyhydroxy-compounds such as sorbitol, pentaerythritol, trimethylol-propane, trimethylol-ethane, hexane-diol, cyclohexane-diol and, saponin, urea, dimethylurea, acetamide, N-methylacetamide, etc.

The image recording material of the present invention may additionally contain a reducing agent represented by formula (IIa) or formula (IIb), whereby the polymerization speed of the polymerizable monomers contained in said material may be enhanced.

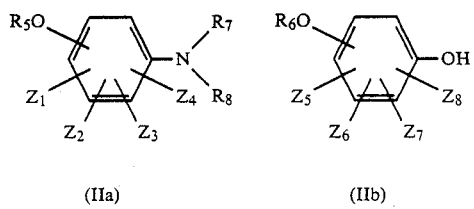

(IIa)    (IIb)

In the above formulae, $R_5$, $R_6$, $R_7$, and $R_8$ each represents a hydrogen atom, an unsubstituted alkyl group, a substituted alkyl group, or an aryl group; $Z_1$ through $Z_8$ each represents a hydrogen atom, an unsubstituted alkyl group, a substituted alkyl group, an alkoxy group, a halogen atom, or an aryl group; and the position of each of the $R_5O-$ group and $R_6O-$ group on the benzene ring may be any of ortho-, meta-, or para-position.

In the reducing agents of formula (IIa), $R_7$ and $R_8$ preferably represent hydrogen atoms.

The reducing agents to be used in the present invention are represented by formulae (IIa) and (IIb), and substituents therein are explained below in greater detail. The alkyl part in the unsubstituted alkyl group and substituted alkyl group of said formulae may be either linear or branched and have from 1 to 8 carbon atoms, preferably from 1 to 5 carbon atoms. Examples of said alkyl groups are methyl group, ethyl group, n-propyl group, isopropyl group, n-butyl group, iso-butyl group, tert-butyl group, n-amyl group, iso-amyl group, tert-amyl group, etc. Examples of substituents of said alkyl groups are a hydroxyl group, a chlorine or bromine atom, an alkoxy group having from 1 to 18 carbon atoms, preferably from 1 to 5 carbon atoms, an unsubstituted phenyl group, a substituted phenyl group (which is substituted in any of o-, m-, or p-position by a substituent of a chlorine or bromine atom or an alkyl group having from 1 to 5 carbon atoms, or an alkoxy group having from 1 to 5 carbon atoms), an acyl group having from 1 to 18 carbon atoms, preferably from 1 to 5 carbon atoms, etc. Aryl groups include an unsubstituted phenyl group and a substituted phenyl group (which is substituted in any of the o-, m-, or p-positions by a substituent of a chlorine or bromine atom or an alkyl group having from 1 to 5 carbon atoms, or an alkoxy group having from 1 to 5 carbon atoms). Alkoxy groups are those having an alkyl group which has from 1 to 18 carbon atoms, and preferably from 1 to 5 carbon atoms. Examples of halogen atoms include chlorine, bromine, fluorine and iodine atoms.

Specific examples of preferred reducing agents are as follows: p-aminophenol, m-aminophenol, o-aminophenol, 2,6-dichloro-p-aminophenol, 2,6-dibromo-p-aminophenol, 2,6-dimethyl-p-aminophenol, 3,5-dimethyl-p-aminophenol, 2-phenyl-p-aminophenol, 2-chlorop-aminophenol, 2,6-dimethoxy-p-aminophenol, 2,3,6-trimethyl-p-aminophenol, 2,3,5-trimethyl-p-aminophenol, 3,6-dimethyl-p-aminophenol, 3-methoxy-p-aminophenol, 3,5-dimethoxy-p-aminophenol, 4-chloro-5-methyl-o-aminophenol, o-(or m- or p-)anisole, catechol, resorcinol, 2-methylresorcinol, orcinol, hydroquinone, methylhydroquinone, p-(or m- or 0-)methoxyphenol, p-benzyloxyphenol, p-ethoxyphenol, 2-methyl-p-methoxyphenol, etc.

The photographic layer of the present invention may further contain, in addition to the above components, known additives such as a preservative, an anti-fogging agent, etc., and furthermore, an antihalation layer, an antistatic layer, or a protective layer may additionally be provided on the image recording material of the present invention.

Supports that may be used include paper, resin-coated paper, film such as polyethylene terephthalate or triacetyl-cellulose, or an aluminium plate, and these may appropriately be selected in accordance with the object and the use of the recording materials.

The amount of each of the components constituting the photographic materials as mentioned above is as follows:

The amount of the photographic silver halide to be used is from 0.001 to 0.5 g, preferably from 0.005 to 0.1 g, per 1 g of the polymerizable vinyl monomer as used. The organic silver salt-oxidizing agent is from 0 to 20 moles, preferably from 0 to 5 moles, per one mole of said silver halide. The hydrazine derivative is from 0.1 to 20 moles, preferably from 0.5 to 5 moles, per one mole of the total silver salt (including the organic silver salt-oxidizing agent, if used). The binder polymer is from 0 to 10 g, preferably used from 0 to 2 g; the base or base precursor is from 0 to 3 g, preferably from 0 to 1 g; the hot-melting solvent is from 0 to 3 g, preferably from 0 to 1 g; and the reducing agent of formula (IIa) or (IIb) is from 0.1 to 20 moles, preferably from 0.5 to 5 moles, per one mole of the total silver salt (including the organic silver salt-oxidizing agent, if used).

The dry film thickness of the photographic layer may widely vary, depending upon the use and the object of the recording materials. For instance, in case the recording material is used for general image recording or lithographic printing, said thickness is from 0.1 to 50 $\mu$m, preferably from 0.5 to 10 $\mu$m; or in case said material is used for letterpress printing or relief printing where a relief itself is used, said thickness is from 1 $\mu$m to 5 mm, preferably from 0.1 to 3 mm.

In the case the development of a silver salt and/or the polymerization of a polymerizable monomer in the present recording material is(are) inhibited by oxygen in air, it is preferred to provide an oxygen-preventive layer composed of a substance having a low oxygen-permeability (such as polyvinyl alcohol, gelatin, or copolymer of vinylidene chloride and vinyl chloride or acrylonitrile, etc.) on the surface of the photographic layer. The film thickness of said oxygen-preventive layer is from 0 to 20 $\mu$m, preferably from 0 to 5 $\mu$m. In case this oxygen-preventive layer is coated, this may act also as a protective layer.

Image recording is carried out, according to the method of the present invention, by imagewise exposure of the above-mentioned image-recording material followed by uniform heating of the exposed material, whereby a polymer is formed on said material in the form of an image.

The image-exposure may be carried out by the use of a light source containing a wavelength to which the photographic silver halide (including a spectral-sensitized one) contained in the recording material is sensitive, for example, tungsten lamp, halogen lamp, mercury lamp, fluorescent lamp, xenon lamp, laser, LED (Light Emittiing Diode), CRT (Cathode Ray Tube), etc., whereupon the visible ray or the ultraviolet ray in said light source is utilized. In addition, X-ray or electron rays may be used for the image-exposure. The exposure varies, depending upon the sensitivity of the slver halide used, and is in general, from $10^{-2}$ to $10^3$ ergs/cm$^2$. Heating may be carried out by the use of a hot plate, heat roller, infrared lamp, oil bath or high frequency induction heating device, with or without the recording material in contact with said heating means. Apart from this, a heat-providing element such as carbon black is incorporated in the recording material, which element is electrically charged to generate Joule's heat therein, whereby said recording material may be heated. The heating temperature is generally within the range of from 80° C. to 200° C., and preferably from 100° C. to 130° C., and the heating time is generally within the range of from 1 to 300 seconds, preferably from 5 to 60 seconds. In case oxygen in air inhibits the polymerization reaction and/or the development of a silver salt in the recording material, a plastic film or the like is preferably provided closely on the photographic layer upon heating.

The polymer thus formed in the form of an image as above is converted to a visible image or is developed by means of various methods in accordance with the use and the object of the recording material, to finally obtain the desired image, and the final image is utilized accordingly. For instance, if the recording material is used as a printing plate or a relief, it may be developed with a solvent. Solvents which may be used for said purpose are those which do not dissolve the polymer image part, but which do dissolve the other non-hardened part. For instance, in case a water-soluble polymer such as polyvinyl alcohol is used as a binder, the material may be developed with water. In this case, a dye or a pigment which does not desensitize or hardly desensitizes a silver halide is preferably incorporated previously in the photographic layer, whereby a visible image may be directly formed by solvent-development. On the other hand, the formed polymer image may be converted to a visible image by means of a dry treatment only. As described in Japanese Patent Publication No. 53-40537, for example, the polymerized part and the non-polymerized part may be separated to different two sheets by peel-apart development, utilizing the difference of the adhesiveness between said polymerized part and the non-polymerized part. (In order to make the formed image visible, the photographic layer is previously colored, as described above.) In addition, the material may be treated with a toner (coloring powder) so that the toner can adhere only to the non-polymerized part to form a visible image.

Moreover, coloration or dye-bleaching reaction may be controlled by means of a polymer, whereby the polymer image may be converted to a visible one. For instance, various conventional means may be utilized therefor, including a method where a two-component type heat-sensitive coloring material is used and the two components therein move, react and color under heat, whereupon the coloration is controlled by the use of an imagewise polymer acting as a barrier (that is, the non-hardened part is colored in this method), as described in Japanese Patent Application (OPI) No. 52-89915; a method where a two-component type coloring material is separated to be inside and outside of monomer-containing microcapsules, and after polymerization, this is developed under pressure so that non-hardened capsules may be crushed and that the material may be colored, as described in Japanese Patent Application (OPI) Nos. 57-179836 and 57-197538; a method where a polymer image is used as a barrier to control the bleaching of a dye (that is, the non-hardened part is bleached in this method), as described in Japanese Patent Application No. 59-241487; and a method where a dye is bleached with a non-polymerized monomer, as described in Japanese Patent Application No. 59-222717.

In case any of said methods for formation of visible image is utilized in the present invention, substances which are necessary in the utilized method may be added to the photographic layer of the recording material of the present invention.

The mechanism for formation of a polymer image in the method of the present invention has not been fully clarified yet, but it is believed that the hydrazine derivative of formula (I) acts to reduce the silver halide having a latent image or the adjacent organic silver salt-oxidizing agent (or develop the silver salt) under heat and said hydrazine derivative itself is oxidized to form a radical and the polymerization of the co-existing monomer is initiated by said radical.

The present invention may be utlized in various uses. For instance, the recording material of the present invention may be used for a printing plate, a proof, a photographic paper, a photographic material for film, a hard copy for video signal, a facsimile recording material, a CRT recording material, a copying material, an OHP film, etc. In any uses, the recording materials of the present invention have various merits over conventional materials, as follows: The sensitivity of the prsent materials are far higher than that of conventional non-silver-type recording materials, and in case a dry treatment system is used in the conversion of the polymer image to a visible one, the desired image may be recorded on the material only by dry-treatment. As compared with conventional silver salt-type photographic materials, the amount of silver used is extremely reduced in the present recording materials, whereas the sensitivity of the present materials is virtually the same as that of conventional materials, and, in addition, the present material may form an image by means of a dry-treatment. Thus, the recording materials of the present invention have various advantageous over conventional materials.

The present invention is explained in greater detail by reference to the following examples, which, however, do not at all restrict the scope of the present invention.

EXAMPLE 1

A mixture solution comprising:
Pentaerythritol tetraacrylate (monomer): 1.8 g
Phthalocyanine: 0.2 g
Methylene chloride: 2.0 g
8 wt% aqueous solution of polyvinyl alcohol (average polymerization degree: about 500): 12.0 g
5 wt% aqueous solution of sodium p-dodecylbenzene-sulfonate: 0.5 g
was emulsified for one hour in an ultrasonic emulsifier, to obtain a monomer emulsion.

6.6 g of benzotriazole and 14 g of gelatin were dissolved in 1500 ml of water, and, while stirring at 40° C., a solution of 8.5 g of silver nitrate dissolved in 50 ml of water was added thereto over the course of 2 minutes, and then the pH value of the resulting solution was adjusted to about 4–5 with NaOH to precipitate the silver benzotriazole. Unnecessary salts ($NaNO_3$) were removed from said solution, and finally, the pH value thereof was adjusted to 6.0, and thus, a silver benzotriazole emulsion (yield: 200 g) was obtained.

A coating solution was prepared from the following components and was coated on a film, as mentioned below:
Monomer emulsion: 10.0 g
Silver bromochloride emulsion (containing 10 wt% of silver bromochloride, in which the molar ratio of chlorine/bromine was 1/1, and 7 wt% of gelatin): 0.3 g
Silver benzotriazole emulsion: 1.2 g
β-Acetyl-p-aminophenylhydrazine: 0.08 g
Sorbitol: 0.36 g
Water: 2.5 g Said solution was coated and dried on a polyethylene terephthalate film in a dry film thickness of about 5 μm, to obtain an image recording material. The coated silver amount was about 0.08 g/m².

The image recording material was exposed to a halogen lamp of 50 lux for 5 seconds, through a black and white step wedge (optical density step: 0.3), and then a polyethylene terephthalate film was closely adhered to the surface of the photographic layer of said material and heated with a hot plate at 125° C. for 60 seconds. Next, the film was peeled off, and the material was dipped in hot water of about 60° C. and warmed for 30 seconds, while being shaken, whereby the non-exposed part in the photographic layer dissolved out into water, and thus, a negative-type blue image comprising sharp eight-stage steps (eight steps) was formed on the material.

EXAMPLE 2

In the same manner as in the Example 1, with the exception that the silver benzotriazole emulsion was not added, an image recording material was formed and developed. As the result, a blue image of seven-stage steps having a slightly lower image density than that of Example 1 was obtained.

EXAMPLE 3

In the same manner as in the Example 1, with the exception that the same amount of Aronix M-8030$^{RTM}$ (polyfunctional polyester-acrylate, made by Toa Gosei Chemical Industry Co., Ltd.) was used instead of the pentaerythritoltetraacrylate, a blue image of nine-stage steps was formed.

EXAMPLE 4

In the same manner as in the Example 1, with the exception that the same amount of β-formyl-p-aminophenylhydrazine was used instead of the β-acetyl-p-aminophenylhydrazine, a blue image of seven-stage steps was formed.

EXAMPLE 5

In the same manner as in the Example 1, with the exception that the same amount of β-formyl-p-methoxyphenylhydrazine was used instead of the β-acetyl-p-aminophenylhydrazine and that 0.36 g of guanidine tri-acetate was added to the coating solution, a blue image of eight-stage steps was formed.

EXAMPLES 6 TO 11

A mixture solution comprising:
Pentaerythritol tetraacrylate: 1.8 g
Phthalocyanine: 0.2 g
Methylene chloride: 2.0 g
8 wt% aqueous solution of polyvinyl alcohol (average polymerization degree: about 500): 12.0 g
5 wt% aqueous solution of sodium p-dodecylbenzene-sulfonate: 0.5 g
was emulsified for one hour in an ultrasonic emulsifier, to obtain a monomer emulsion.

6.6 g of benzotriazole and 14 g of gelatin were dissolved in 1500 ml of water, and, while stirring at 40° C., a solution of 8.5 g of silver nitrate dissolved in 50 ml of water was added thereto in the course of 2 minutes, and then the pH value of the resulting solution was adjusted to about 4-5 with NaOH to precipitate the silver benzotriazole. Unnecessary salts ($NaNO_3$) were removed from said solution, and the pH value thereof was adjusted to 6.0, and thus, a silver benzotriazole emulsion was obtained. Yield: 200 g.

A coating solution was prepared from the following components and was coated on a film, as mentioned below:
Monomer emulsion: 10.0 g
Silver bromochloride emulsion (containing 10 wt% of silver bromochloride, in which the molar ratio of chlorine/bromine was 1/1, and 7 wt% of gelatin): 0.3 g
Silver benzotriazole emulsion: 1.2 g
β-acetylphenylhydrazine: 0.15 g
Reducing agent as listed in the following Table 1: 0.1 g
Sorbitol: 0.36 g
Guanidine tri-acetate: 0.36 g
Water: 2.5 g Said solution was coated and dried on a polyethylene terephthalate film in a dry film thickness of about 5 μm, to obtain an image recording material. The coated silver amount was about 0.08 g/m².

TABLE 1

| Example No. | Reducing Agent |
| --- | --- |
| 6 | p-methoxyphenol |
| 7 | o-methoxyphenol |
| 8 | hydroquinone |
| 9 | 2-methylresorcinol |
| 10 | m-N,N—dimethylaminophenol |
| 11 | p-methoxyaniline |

Each of the image recording materials thus obtained was exposed to a halogen lamp of 50 lux for 5 seconds, through a black and white step wedge (optical density step: 0.3), and then a polyethylene terephthalate film was closely adhered to the surface of the photographic layer of said material and heated with a hot plate at 125° C. for 40 seconds. Next, the film was peeled off, and the material was dipped in hot water of about 60° C. and warmed for 60 seconds, while being shaken, whereby the non-exposed part in the photographic layer dissolved out into water. As a result, a negative-type blue image comprising six to seven-stage steps was obtained on each of the materials containing said reducing agent.

EXAMPLES 12 TO 14

In the same manner as in the Example 6 (where p-methoxyphenol was used as a reducing agent), with the exception that the same amount of a hydrazine derivative as listed in the following Table 2 was used instead of the β-acetylphenylhydrazine, a similar image as in the Example 6 was formed on each of the formed recording materials containing each of the following hydrazine derivatives.

TABLE 2

| Example No. | Hydrazine Derivative |
| --- | --- |
| 12 | β-formyl-p-tolylhydrazine |
| 13 | β-1,1-dimethylolpropionyl-p-tolylhydrazine |
| 14 | β-trimethylolacetyl-p-tolylhydrazine |

EXAMPLE 15

A mixture solution comprising:
Pentaerythritol tetraacrylate: 2.3 g
Phthalocyanine: 0.1 g
Methylene chloride: 3.0 g
8 wt% aqueous solution of polyvinyl alcohol (average polymerization degree: about 500): 18.0 g
5 wt% aqueous solution of sodium p-dodecylbenzene-sulfonate: 0.8 g
was emulsified for one hour in an ultrasonic emulsifier, to obtain a monomer emulsion.

6.6 g of benzotriazole and 14 g of gelatin were dissolved in 1500 ml of water, and, while stirred at 40° C., a solution of 8.5 g of silver nitrate dissolved in 50 ml of water was added thereto in the course of 2 minutes, and then, the pH value of the resulting solution was adjusted to about 4-5 with NaOH to precipitate the silver benzotriazole. Unnecessary salts ($NaNO_3$) were removed from said solution, and finally, the pH value thereof was adjusted to 6.0, and thus, a silver benzotriazole emulsion was obtained. Yield: 200 g.

A coating solution was prepared from the following components and was coated on a film, as mentioned below:
Monomer emulsion: 2.4 g
Silver bromochloride emulsion (containing 10 wt% of silver bromochloride, in which the molar ratio of chlorine/bromine was 1/1, and 7 wt% of gelatin): 0.08 g
Silver benzotriazole emulsion: 0.32 g
Hydrazine derivative as listed in the following Table 3: (amount as mentioned in said Table)
Reducing agent as listed in Table 3: (amount as mentioned in said Table)
Sorbitol: 0.08 g
Water: 0.64 g Said solution was coated and dried on a polyethylene terephthalate film in a dry film thickness of about 5 μm, to obtain an image recording material. The coated silver amount was about 0.1 g/m².

A half of each of the image recording materials thus obtained was covered with a black paper and the other half thereof was not, and these were exposed to a halogen lamp of 50 lux for 5 seconds, and then a polyethylene terephthalate film was closely adhered to the surface of the photographic layer of each material and heated with a hot plate at 125° C. for a predetermined period of time. Next, the film was peeled off from the photographic layer, and the image recording material was dipped in hot water of about 60° C. and warmed for 30 seconds, while being shaken, whereby the nonexposed part in the photographic layer dissolved out into the water. After drying, the optical density of the photographic layer (colored in blue with phthalocyanine) remained in the hardened part was measured. Each of the image recording materials was variously tested with the heating time changed variously, and the heating time enough to attain a half (½) of the maximum density (or the optical density of the photographic layer before dipping in water) of the image density was checked for each case. (Said time was called $t_\frac{1}{2}$.) The value of said $t_\frac{1}{2}$ of each recording material is set forth in the Table 3.

TABLE 3

| Sample No. | Hydrazine Derivative | Reducing Agent | $t_\frac{1}{2}$ (sec.) |
|---|---|---|---|
| 1 | β-acetyl-p-aminophenylhydrazine (0.021 g) | p-aminophenol (0.014 g) | 5 |
| 2 | " | m-aminophenol (0.014 g) | 9 |
| 3 | " | o-aminophenol (0.014 g) | 8 |
| 4 | " | 2,6-dichloro-p-aminophenol (0.023 g) | 7 |
| 5 | " | 3,5-dimethyl-p-aminophenol (0.018 g) | 4 |
| 6 (comparative) | " | (none) | 25 |
| 7 | β-formyl-p-aminophenylhydrazine (0.010 g) | p-aminophenol (0.014 g) | 9 |
| 8 | " | m-aminophenol (0.014 g) | 15 |
| 9 | " | o-aminophenol (0.014 g) | 10 |
| 10 | " | 2,6-dichloro-p-aminophenol (0.023 g) | 7 |
| 11 | " | 3,5-dimethyl-p-aminophenol (0.018 g) | 6 |
| 12 (comparative) | " | (none) | 18 |
| 13 | β-formyl-p-methoxyphenylhydrazine (0.021 g) | 2,6-dichloro-p-aminophenol (0.023 g) | 11 |
| 14 (comparative) | " | (none) | 45 |
| 15 | β-acetyl-p-aminophenylhydrazine (0.021 g) | p-anisidine (0.010 g) | 10 |
| 16 | " | 2-methylresorcinol (0.016 g) | 13 |
| 17 | " | orcinol (0.016 g) | 13 |
| 18 | " | hydroquinone (0.014 g) | 12 |
| 19 | " | p-methoxyphenol (0.016 g) | 14 |

From the above test samples, the following facts were noted. In the case that the photographic layer contained no hydrazine derivative, none of the reducing agents used could form any image at all, even after heating for 200 seconds. Every combination of said reducing agent-hydrazine derivative reduced the $t_\frac{1}{2}$ value to significantly as compared with the samples containing no reducing agent (see "comparative" sample in Table 3). The unexpected synergestic effect of the reducing agent and the hydrazine derivative was noted to be quite pronounced.

Next, each of the recording materials was exposed through a step-wedge (optical density step: 0.3) and heated as in Example 15. The heating time was twice the time of said $t_\frac{1}{2}$ value of each material as shown in Table 3. Afterwards, the non-hardened part was dissolved out in water in the same manner as mentioned above, and thus, a sharp blue image which was negative to the wedge and which comprised about six to eight-stage steps was formed in all recording materials (including the comparative cases).

While the invention has been described in detail and with reference to specific embodiments thereof, it will be apparent to one skilled in the art that various changes and modifications can be made therein without departing from the spirit and scope thereof.

What is claimed is:

1. A method for recording a photographic image on an image-recording material, wherein an image-recording material comprising a photographic silver halide emulsion containing silver halide in an amount of from 0.001 to 0.5 g per gram of polymerizable vinyl monomer, a polymerizable vinyl monomer, and from 0.1 to 20 moles per mole of the silver halide of a hydrazine derivative represented by formula (I)

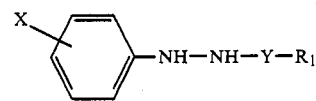

wherein X represents a hydrogen atom, an alkyl group, or a group represented by

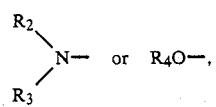

positioned in an ortho-, meta- or para-position on the benzene ring; Y represents

or —SO$_2$—; R$_1$, R$_2$, R$_3$ and R$_4$ each represents a hydrogen atom, an unsubstituted alkyl group, or a substituted alkyl group, provided that R$_1$ represents hydrogen atom only when Y represents

on a support is imagewise exposed to form a latent image in said photographic silver halide emulsion and then developed by heating for 1 to 300 seconds essentially in an absence of water at from 80° C. to 200° C. so as to polymerize said polymerizable vinyl monomer in the part having said latent image to form a polymer image therein, and wherein said image recording material contains a reducing agent represented by formula (IIa) or formula (IIb)

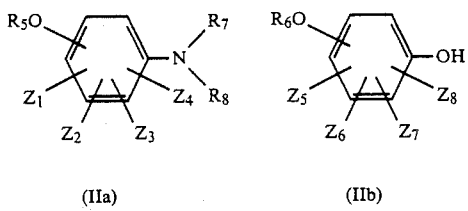

(IIa)  (IIb)

wherein $R_5$, $R_6$, $R_7$, and $R_8$ each represents a hydrogen atom, an unsubstituted alkyl group, a substituted alkyl group, or an aryl group; $Z_1$ through $Z_8$ each represents a hydrogen atom, an unsubstituted alkyl group, a substituted alkyl group, an alkoxy group, a halogen atom, or an aryl group; and the position of each of the $R_5O$-group and $R_6O$-group on the benzene ring may be any of ortho-, meta-, or para-position.

2. A method for recording a photographic image on an image-recording material as in claim 1, wherein X represents

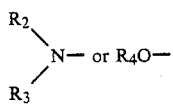

positioned in an ortho- or para-position on the benzene ring, wherein $R_2$, $R_3$, and $R_4$ have the same meanings as in claim 1.

3. A method for recording a photographic image on an image-recording material as in claim 1, wherein said image-recording material contains a reducing agent of formula (IIa) in which $R_7$ and $R_8$ represent hydrogen atoms.

4. A method for recording a photographic image on an image-recording material as in claim 1, wherein said image-recording material further contains an organic silver salt-oxidizing agent.

5. A method for recording a photographic image on an image-recording material as in claim 4, wherein said image-recording material contains the photographic silver halide in an amount of from 0.001 to 0.5 g per gram of polymerizable vinyl monomer, the organic silver salt-oxidizing agent in an amount of 20 moles or less per mole of the photographic silver halide, and the hydrazine derivative of formula (I) in an amount of from 0.1 to 20 moles per mole of the total moles of the photographic silver halide and the organic silver salt-oxidizing agent.

6. A method for recording a photographic image on an image-recording material as in claim 1, wherein said image-recording material contains the photographic silver halide in an amount of from 0.001 to 0.5 g per gram of the polymerizable vinyl monomer and contains the hydrazine derivative of formula (I) and reducing agent of formula (IIa) or (IIb) each in an amount of from 0.1 to 20 moles on the basis of 1 mole of the photographic silver halide.

7. A method for recording a photographic image on an image-recording material as in claim 1, wherein said image-recording material further contains an organic silver salt-oxidizing agent.

8. A method for recording a photographic image on an image-recording material as in claim 7, wherein said image-recording material contains the photographic silver halide in an amount of from 0.001 to 0.5 g per gram of the polymerizable vinyl monomer, the organic silver salt-oxidizing agent in an amount of 20 moles or less per mole of the photographic silver halide, and the hydrazine derivative of formula (I) and the reducing agent of formula (IIa) or (IIb) each in an amount of from 0.1 to 20 moles per mole of the total moles of the photographic silver halide and the organic silver salt-oxidizing agent.

9. A method for recording a photographic image on an image-recording material as in claim 1, wherein said image-recording material further contains a binder, a base, a base precursor, or a hot-melting solvent.

10. A method for recording a photographic image on an image-recording material as in claim 1, wherein said image-recording material further contains a binder polymer, a base, a base precursor, or a hot-melting solvent.

11. A method for recording a photographic image on an image-recording material as in claim 1, wherein said photographic silver halide, polymerizable vinyl monomer, and hydrazine derivative represented by formula (I) are coated in a single layer.

12. A method for recording a photographic image on an image-recording material as in claim 1, wherein the photographic silver halide emulsion, polymerizable vinyl monomer, and hydrazine derivative are coated on a support to form a single layer.

13. A method for recording a photographic image on an image-recording material as in claim 1, wherein the photographic layer comprises two or more adjacent layers.

14. A method for recording a photographic image on an image-recording material as in claim 13, wherein only one of the photographic layers contains the hydrazine derivative.

15. A method for recording a photographic image on an image-recording material as in claim 13, wherein one layer contains the hydrazine derivative but not the silver halide or polymerizable vinyl monomer.

* * * * *